(12) United States Patent
Troia

(10) Patent No.: US 10,482,030 B2
(45) Date of Patent: *Nov. 19, 2019

(54) METHODS OF MEMORY ADDRESS VERIFICATION AND MEMORY DEVICES EMPLOYING THE SAME

(71) Applicant: Micron Technology, Inc., Boise, ID (US)

(72) Inventor: Alberto Troia, München (DE)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/269,417

(22) Filed: Feb. 6, 2019

(65) Prior Publication Data

US 2019/0171579 A1  Jun. 6, 2019

Related U.S. Application Data

(63) Continuation of application No. 15/687,169, filed on Aug. 25, 2017, now Pat. No. 10,261,914.

(51) Int. Cl.
  *G11C 8/00* (2006.01)
  *G06F 12/1018* (2016.01)
  (Continued)

(52) U.S. Cl.
  CPC .......... *G06F 12/1018* (2013.01); *G06F 3/061* (2013.01); *G06F 3/0655* (2013.01);
  (Continued)

(58) Field of Classification Search
  CPC .... G06F 12/1018; G06F 3/061; G06F 3/0655; G06F 3/0688; G06F 12/0246; G06F 2212/7201
  See application file for complete search history.

(56) References Cited

U.S. PATENT DOCUMENTS 5,561,765 A  10/1996  Shaffer et al.
5,717,871 A  2/1998  Hsieh et al.
(Continued)

FOREIGN PATENT DOCUMENTS

WO  2005066794 A2  7/2005

OTHER PUBLICATIONS

Bach, M., "Technology Primer: Low Voltage RAM", Jul. 16, 2012, Puget Systems, 2012, 5 pages, retrieved Nov. 14, 2018 from: https://pugetsystems.com/labs/articles/technology-primer-low-voltage-ram-150/.
(Continued)

*Primary Examiner* — Pho M Luu
(74) *Attorney, Agent, or Firm* — Perkins Coie LLP

(57) ABSTRACT

A memory device and methods for operating the same are provided. The memory device includes an array of memory cells, and a controller configured to receive a data word to be stored at an address in the array and to store, at the address in the array, the data word and a location indicia corresponding to the address. The controller can be further configured to command the array to read the data word from the address, to receive response data from the array, and to verify that a location indicia of the response data corresponds to the address. If the location indicia of the response data does not correspond to the address, the controller can be further configured to indicate an error.

20 Claims, 8 Drawing Sheets

(51) Int. Cl.
    *G06F 3/06*     (2006.01)
    *G06F 12/02*     (2006.01)

(52) U.S. Cl.
    CPC ........ *G06F 3/0688* (2013.01); *G06F 12/0246* (2013.01); *G06F 2212/7201* (2013.01)

(56) References Cited

U.S. PATENT DOCUMENTS

| | | | |
|---|---|---|---|
| 8,427,867 B2 | 4/2013 | Weingarten | |
| 8,976,594 B2 | 3/2015 | Tanzawa | |
| 9,230,658 B2 * | 1/2016 | Han | G11C 8/08 |
| 9,368,223 B2 * | 6/2016 | Jung | G06F 12/0253 |
| 9,454,496 B2 | 9/2016 | Lim | |
| 10,261,914 B2 * | 4/2019 | Troia | G06F 12/1018 |
| 2002/0166038 A1 | 11/2002 | MacLeod | |
| 2006/0069896 A1 | 3/2006 | Sanders | |
| 2010/0146219 A1 | 6/2010 | Chun et al. | |
| 2010/0262739 A1 | 10/2010 | Durham et al. | |
| 2013/0159629 A1 | 6/2013 | Sadri et al. | |
| 2014/0149833 A1 | 5/2014 | Sauber et al. | |
| 2014/0244586 A1 | 8/2014 | Ngo | |
| 2014/0289575 A1 | 9/2014 | Sutardja et al. | |
| 2015/0169570 A1 | 6/2015 | Shim et al. | |
| 2016/0027481 A1 | 1/2016 | Hong | |
| 2016/0350241 A1 | 12/2016 | Ichimura et al. | |

OTHER PUBLICATIONS

International Application No. PCT/US2018/042679—International Search Report and Written Opinion, dated Nov. 14, 2018, 14 pages.
International Application No. PCT/US2018/042691—International Search Report and Written Opinion, dated Nov. 27, 2018, 19 pages.
Vatto, K., "Samsung SSD 840 EVO mSATA (120GB, 250GB, 500GB & 1TB) Review", AnandTech, Jan. 9, 2014, 5 pages, retrieved Nov. 14, 2018 from: https://www.anandtech.com/show/7594/samsung-ssd-840-evo-msata-120gb-250gb-500gb-1tb-review/8.

* cited by examiner

METHODS OF MEMORY ADDRESS VERIFICATION AND MEMORY DEVICES EMPLOYING THE SAME

CROSS-REFERENCE TO RELATED APPLICATIONS

This application is a continuation of U.S. patent application Ser. No. 15/687,169, filed Aug. 25, 2017, now U.S. Pat. No. 10,261,914; which is incorporated herein by reference in its entirety.

This application contains subject matter related to an U.S. Patent Application by Alberto Troia, entitled "METHODS OF MEMORY ADDRESS VERIFICATION AND MEMORY DEVICES EMPLOYING THE SAME." The related application, of which the disclosure is incorporated by reference herein, is assigned to Micron Technology, Inc., and is identified as U.S. patent application Ser. No. 15/687,069, filed Aug. 25, 2017.

TECHNICAL FIELD

The present disclosure generally relates to memory devices, and more particularly relates to methods of memory address verification and memory devices employing the same.

BACKGROUND

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), resistive random access memory (RRAM), and magnetic random access memory (MRAM), among others.

Memory devices can include large arrays of memory cells for storing data, frequently organized into rows and columns. Individual memory cells and/or ranges of memory cells can be addressed by their row and column. When a memory array is addressed, there may be one or more layers of address translation, to e.g., translate between a logical address utilized by a host device and a physical address corresponding to a location in the memory array. Although uncommon, it is possible for the address information provided to a memory device on a command/address bus thereof to be corrupted by an error, such that an internal operation of the memory device (e.g., a read operation, a write operation, an erase operation, etc.) can be performed on a different physical address than was targeted by a host device or a controller of the memory device. Accordingly, a way to verify that a memory operation has been performed at the intended address is required.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those skilled in the art are not discussed in detail below (e.g., circuit components such as multiplexers and decoders, data structures such as address registers and data registers, etc.). In general, it should be understood that various other devices, systems, and methods in addition to those specific embodiments disclosed herein may be within the scope of the present technology.

As discussed above, errors that affect address information provided to a memory device on a command/address bus (e.g., during address translation, during command/address bus operations, etc.) can cause a memory operation to be performed at a different address in a memory array of the memory device than was targeted. Accordingly, several embodiments of memory devices in accordance with the present technology verify that the address on which an operation is performed corresponds to the address which has been targeted for the operation by a controller and/or a host device.

Several embodiments of the present technology are directed to memory devices, systems including memory devices, and methods of operating memory devices. In one embodiment, a memory device is provided. The memory device includes an array of memory cells, and a controller configured to receive a data word to be stored at a address in the array and to store, at the address in the array, the data word and a location indicia corresponding to the address. The controller can be further configured to command the array to read the data word from the address, to receive response data from the array, and to verify that a location indicia of the response data corresponds to the address. If the second location indicia does not correspond to the address, the controller can be further configured to indicate an error.

Figure 1:
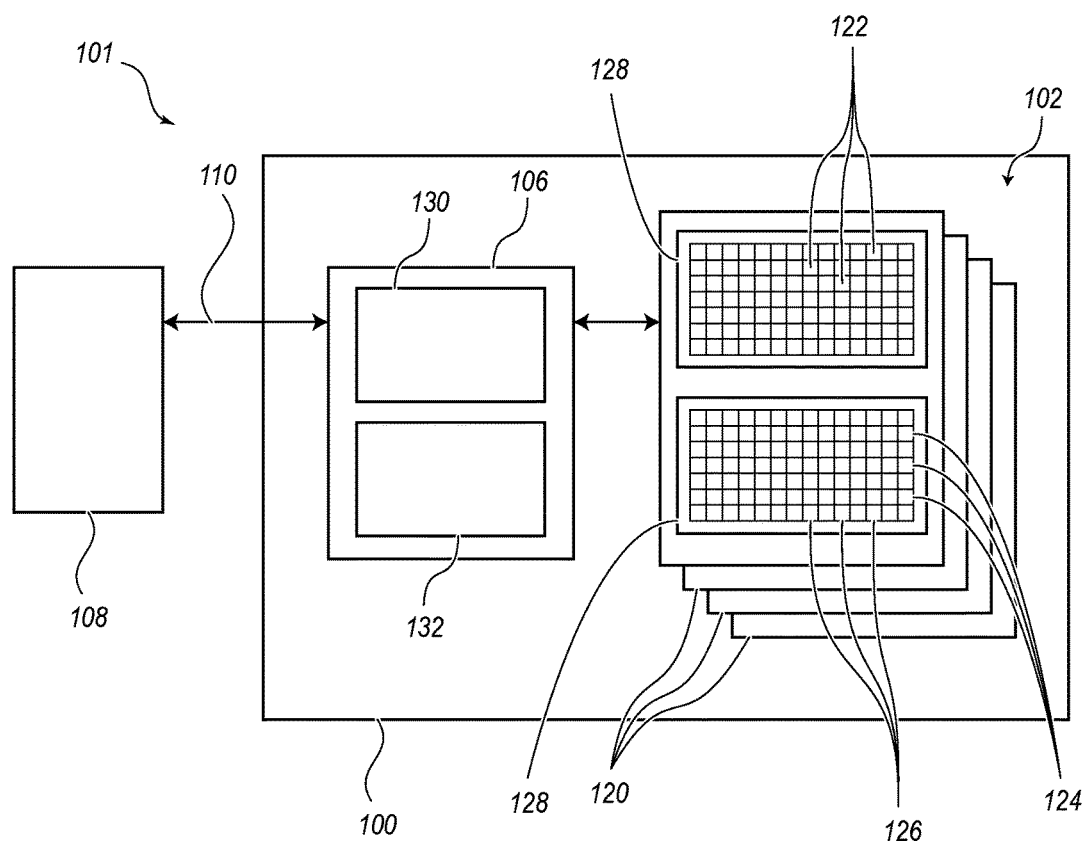
FIG. 1 is a block diagram illustrating a memory system in accordance with an embodiment of the present technology.

FIG. 1 is a block diagram of a system 101 having a memory device 100 configured in accordance with an embodiment of the present technology. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. In another embodiment, the memory cells 122 can include volatile memory cells, such as DRAM or SRAM cells. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.).

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, memory device 100 can include two, three, four, eight, ten, or more (e.g., 16, 32, 64, or more) memory units 120. Although the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof.

For example, host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device (e.g., over a networked connection or through intermediary devices).

In accordance with an embodiment of the present technology, the controller 106 and/or the host device 108 can be configured to verify that the address on which a memory operation is performed corresponds to an intended address to detect and/or prevent errors in the address information provided to the memory device 100 or the main memory 102 on a command/address bus thereof (e.g., during address translation, during command/address bus operations, etc.) from performing a memory operation to be performed at a different physical address in the main memory 102 than is desired. In this regard, when the controller 106 receives from the host device 108 data to be stored in the main memory 102, it is configured to store at an address of the main memory both the data and a location indicia corresponding to the address at which the data is stored. When the data is subsequently requested to be read out of the main memory 102, the controller is configured to command the main memory to read out both the data and the location indicia for the address, and to compare the location indicia to the address to verify that the data received from the main memory 102 corresponds to the data sought to be retrieved.

In accordance with an embodiment of the present technology, the location indicia stored with the data in the main memory 102 can be the full address at which the data is stored. Alternatively, to reduce the amount of storage dedicated to storing the location indicia, it can be a hash, checksum or a subset (e.g., row, bank, rank, device, chip, etc.) of the address at which the data is stored. Using hash, checksum or a subset of the address rather than the whole address, while reducing the amount of storage consumed by the location indicia, can increase the risk of a collision (e.g., if a memory address experiences an error and is inadvertently changed, through a bit error or the like, into a different memory address which generates the same location indicia as the intended memory address). Accordingly, memory systems and devices may be designed according to a balance of storage consumed by the location indicia and tolerance for collisions (e.g., for systems and devices in which there is less tolerance for potential errors caused by collisions, such as vehicular control, life support, or munitions targeting systems, a hash, subset or checksum with a lower collision likelihood, or even the whole address, may be used in generating the location indicia).

The term "address", as set forth herein, can mean either a physical address or a logical address. In some embodiments, the location indicia can correspond to either a physical address or a logical address.

In accordance with an embodiment of the present technology, the generation of the location indicia from an address (e.g., the hashing or translation of an address into a location indicia) may be performed either in the controller 106 or in the host 108. Any one of a number of suitable hashing or checksum algorithms well known to those skilled in the art may be used to generate the location indicia, including a cyclic redundancy check (CRC), a longitudinal parity check, a check digit, a parity bit, BSD checksum, or the like.

Figure 2:
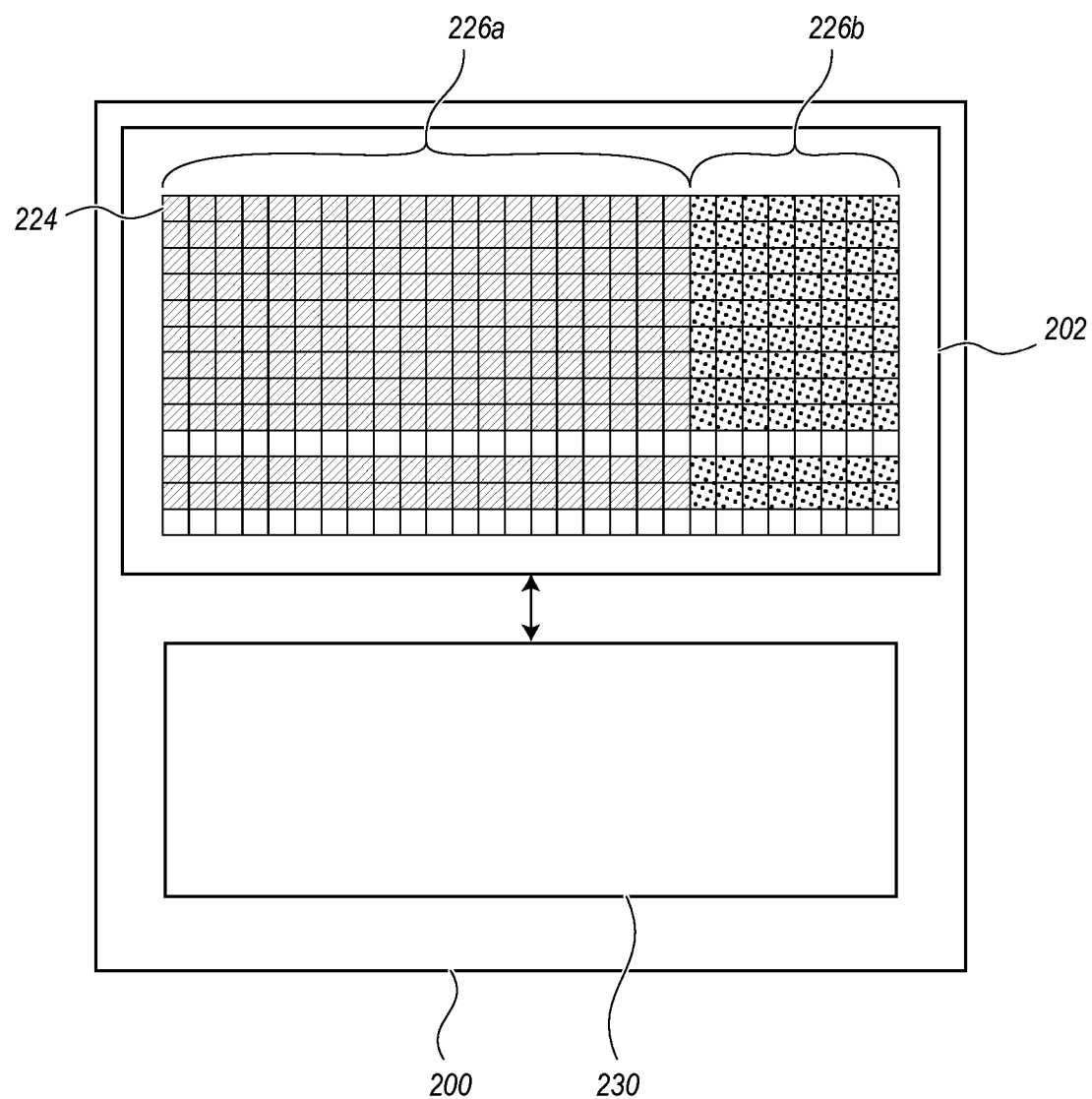
FIG. 2 schematically illustrates a memory device in accordance with an embodiment of the present technology.

To store the location indicia with the data at the address, a memory device implementing an embodiment of the present technology can use any one of a number of approaches. For example, FIG. 2 schematically illustrates a memory device 200 in accordance with an embodiment of the present technology, in which the location indicia is appended to the data stored at the address. In this regard, memory device 200 includes a memory array 202 and a controller 230 configured to receive a first data word to be stored at a first address 224 in the memory array 202. The controller 230 is further configured to store, at the first address 224 in the memory array 202, the first data word and a first location indicia corresponding to the first address 224. As can be seen with reference to FIG. 2, the data word is stored in a first plurality of columns 226a along a row corresponding to the address 224, while the location indicia has been appended in a second plurality of columns 226b in the same row.

As set forth above, in accordance with an embodiment of the present technology, both the data word and the location indicia can be read out of the memory array 202 in response to a read command targeting the address. The location indicia can be compared to the address (e.g., by performing a similar translation, checksum or hashing operation on the targeted address to generate a target location indicia, and verifying that the target location indicia corresponds to the read-out location indicia). The generation and/or comparison of the target location indicia can be performed in the controller 230 and/or in a connected host device. If the comparison is performed in the controller 230, a mismatch between the targeted address and the location indicia retrieved from the memory array 202 can be indicated by an error message output by the memory device 200 (e.g., utilizing an existing or a new protocol on the bus by which the memory device 200 is connected to a host, or by a dedicated pin out flagging an error, etc.).

Figure 3:
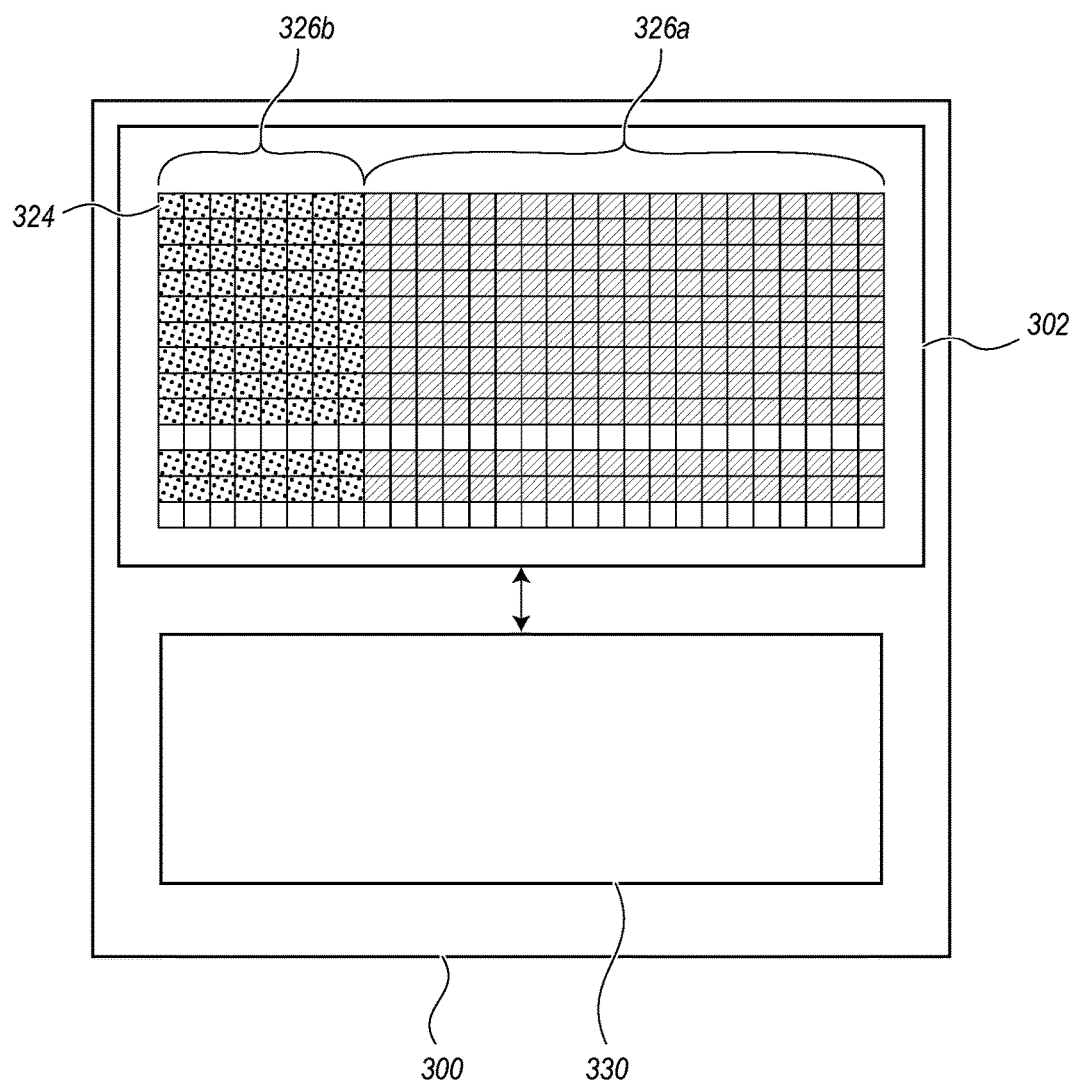
FIG. 3 schematically illustrates a memory device in accordance with an embodiment of the present technology.

In accordance with another embodiment, the location indicia can be prepended to the data word, instead of appended. Such an arrangement is illustrated schematically in FIG. 3, in accordance with an embodiment of the present technology. As can be seen with reference to FIG. 3, a memory device 300 includes a memory array 302 and a controller 330 configured to receive a first data word to be stored at a first address 324 in the memory array 302. The controller 330 is further configured to store, at the first address 324 in the memory array 302, the first data word and a first location indicia corresponding to the first address 324. As can be seen with reference to FIG. 3, the data word is stored in a first plurality of columns 326a along a row corresponding to the address 324, while the location indicia has been prepended in a second plurality of columns 326b in the same row.

Although in the present and foregoing embodiment data words and location indicia are described and illustrated as occupying a plurality of cells in a memory array (e.g., corresponding to more than one bit of data), in other embodiments of the present technology a data word and/or a location indicia can comprise only a single bit of information. Alternatively, a data word and/or a location indicia can include multiple bits of information, yet each still being stored in a single memory cell (e.g., in a multi-level cell capable of storing more than one bit of information).

By prepending or appending the location indicia in columns at the end of a row in which user data is stored, the memory device can be configured to provide address verification without reducing the user-addressable amount of memory (e.g., by increasing the column count of the array by a sufficient number of columns to store a location indicia of a desired size). In many memory devices, the provisioning of space in a memory array for error correction is accomplished in a similar way (e.g., by increasing the column count of the array to provide additional room for metadata such as ECC information without reducing the user-addressable storage space).

Figure 4:
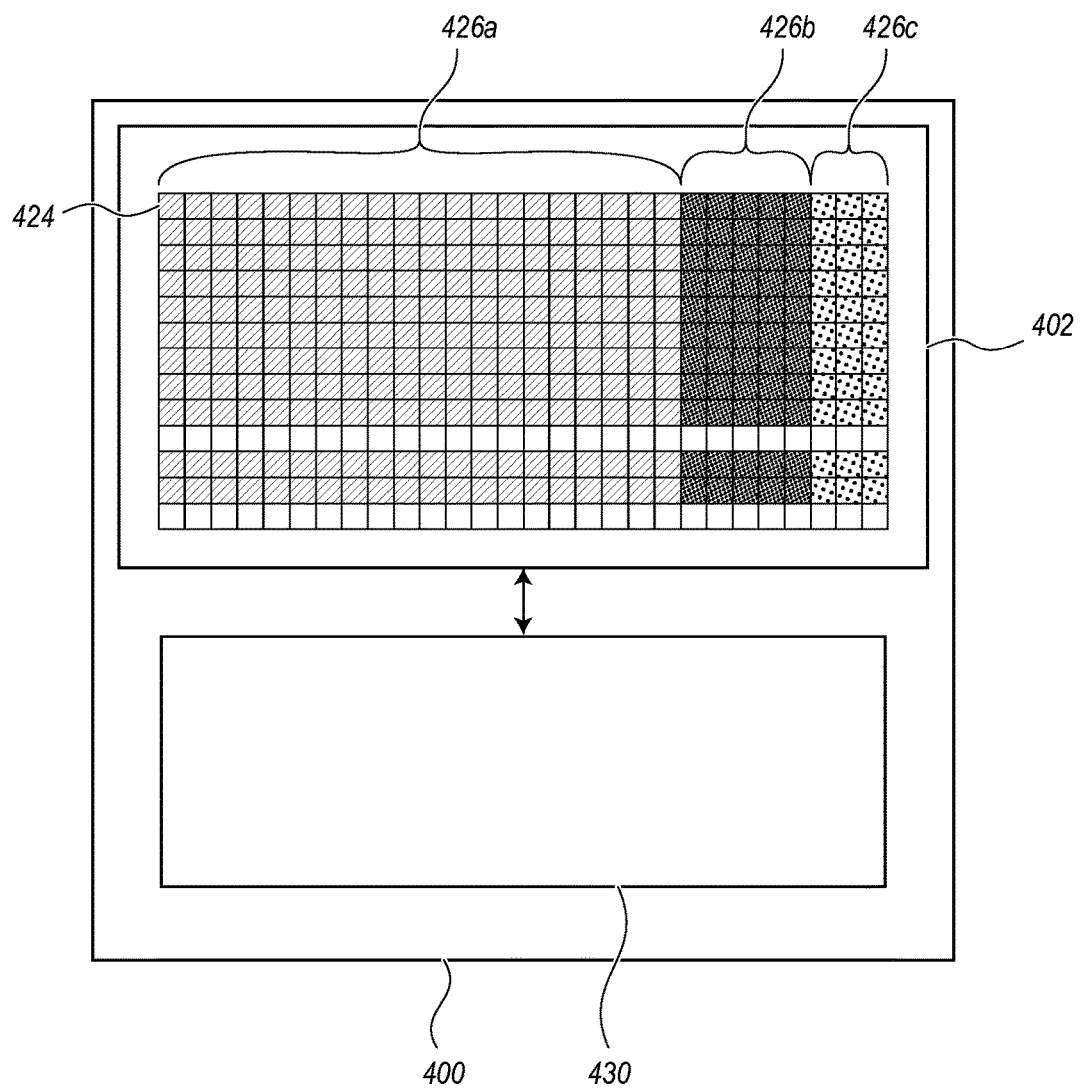
FIG. 4 schematically illustrates a memory device in accordance with an embodiment of the present technology.

In that regard, FIG. 4 schematically illustrates another embodiment of the present technology, in which a memory device 400 is configured to append a location indicia to data stored at an address in a memory array, in combination with ECC information or other metadata. In this regard, memory device 400 includes a memory array 402 and a controller 430 configured to receive a first data word to be stored at a first address 424 in the memory array 402. The controller 430 is further configured to store, at the first address 424 in the memory array 402, the first data word, error correction information corresponding to the first data word, and a first location indicia corresponding to the first address 424. As can be seen with reference to FIG. 4, the data word is stored in a first plurality of columns 426a along a row corresponding to the address 424, the ECC information is stored in a second plurality of columns 426b in the same row, and the location indicia has been appended in a third plurality of columns 426c in the same row.

Figure 5:
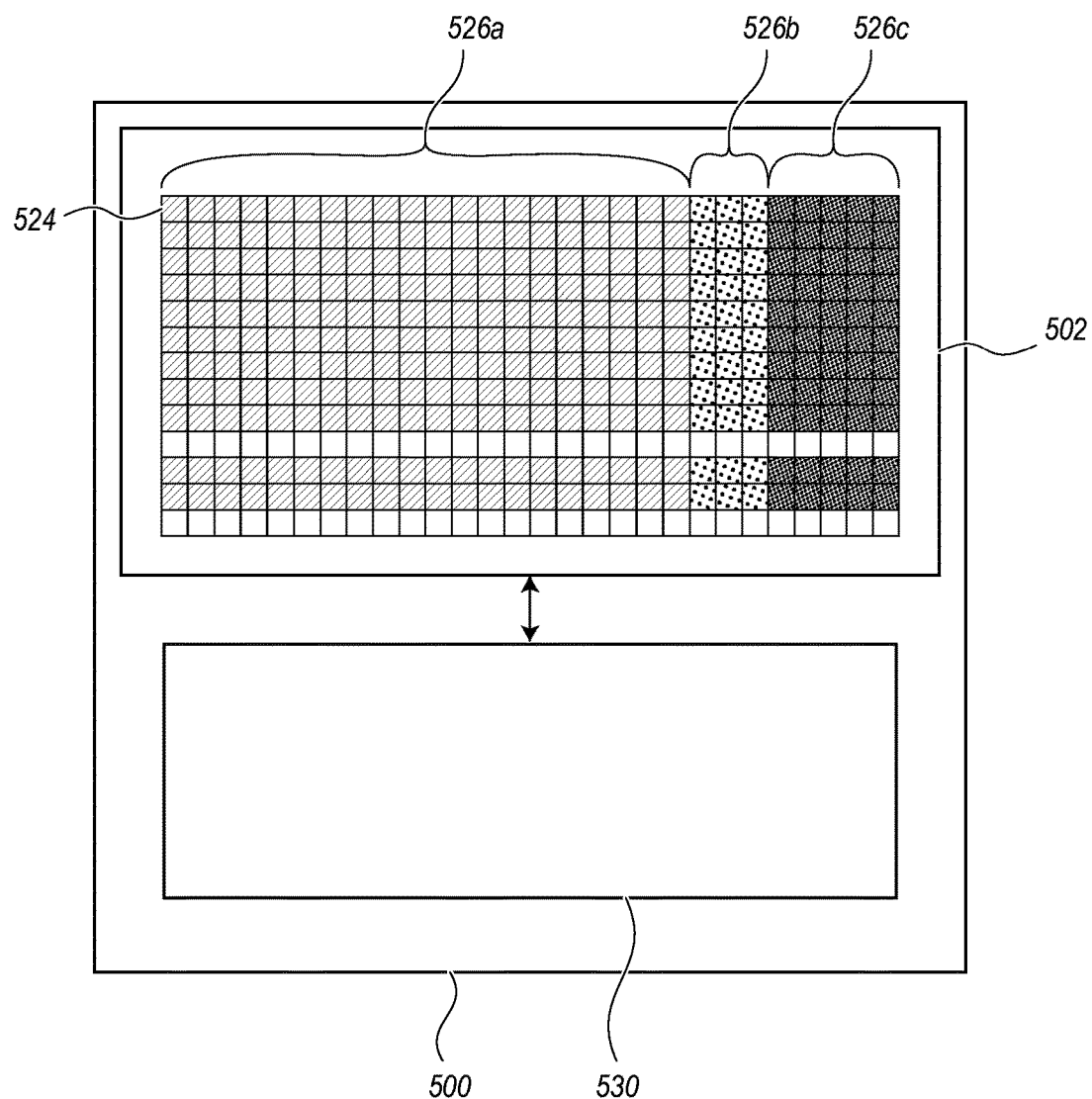
FIG. 5 schematically illustrates a memory device in accordance with an embodiment of the present technology.

ECC information is frequently generated and stored adjacent the data for which it provides error correction capability in a memory array to detect and correct any errors in the data that may arise from any one of a number of physical effects involved in data storage (e.g., charge leakage, disturb effects, thermal degradation, etc.). According to an embodiment of the present technology, the location indicia generated and stored with the data word in a memory array can also be protected by ECC information to detect and/or correct errors not only in the data word, but in the location indicia used to verify the address information used to access the data, as set forth in greater detail above. In this regard, FIG. 5 schematically illustrates a memory device 500 that includes a memory array 502 and a controller 530 configured to receive a first data word to be stored at a first address 524 in the memory array 502. The controller 530 is further configured to store, at the first address 524 in the memory array 502, the first data word, error correction information corresponding to the first data word and the first location indicia, and a first location indicia corresponding to the first address 524. As can be seen with reference to FIG. 5, the data word is stored in a first plurality of columns 526a along a row corresponding to the address 524, while the location indicia has been appended in a second plurality of columns 526b in the same row. Additionally, ECC information corresponding to both the data word and the location indicia is stored in a third plurality of columns 526c in the same row. Techniques for the generation and evaluation of ECC information for the detection and correction of errors in stored data (e.g., the data word and/or the location indicia) are well-known to those skilled in the art, and can be variously accomplished in the controller 530, an operably connected host (not illustrated), or both.

Although in the foregoing embodiments of the present technology data words and location indicia have been illustrated schematically as being stored in single continuous rows of a memory array, other approaches to storing, at an address, both a data word and a location indicia corresponding to the address can be used. For example, an address may correspond to a group of rows, in which case a data word and/or a location indicia may span more than one row in a memory array. Alternatively, an address may correspond to less than a row of the memory array, in which case a single row in the array could include multiple data words with multiple corresponding location indicia. In some such embodiments, at each access of any one of the multiple addresses in the row, the location indicia corresponding to the data word to be written at the target address in the row can be computed and compared with the location indicia already stored at the end of that row, such that if the two are the same (e.g., a match), the new data word can be written to the address at the row (e.g., and an error otherwise indicated). Within this context, storing a location indicia (corresponding to the address) may comprise only verifying that a stored location indicia is equal to it, therefore without overwriting the same information. If no location indicia is already present at the end of the row of multiple addresses (e.g., if the subject operation is the first write operation to the row), then the location indicia is written to the end of the row as described above. This approach of sharing a single location indicia among multiple addresses in a row can reduce the number of additional columns utilized to store the location indicia (e.g., that is common to all information on the same row). For memory arrays not arranged in rows and columns, data words and location indicia may be stored at an address in other ways readily apparent to those skilled in the art.

Moreover, although in the foregoing embodiments of the present technology location indicia have been illustrated and described as being prepended or appended to a data word at an address in a memory array, other approaches to storing, at an address, both a data word and a location indicia corresponding to the address can be used. For example, in various embodiments of the present technology, a location indicia can be interleaved with a data word, combined with a data word (e.g., using data compression, bitwise operations, etc.) or the like.

Figure 6:
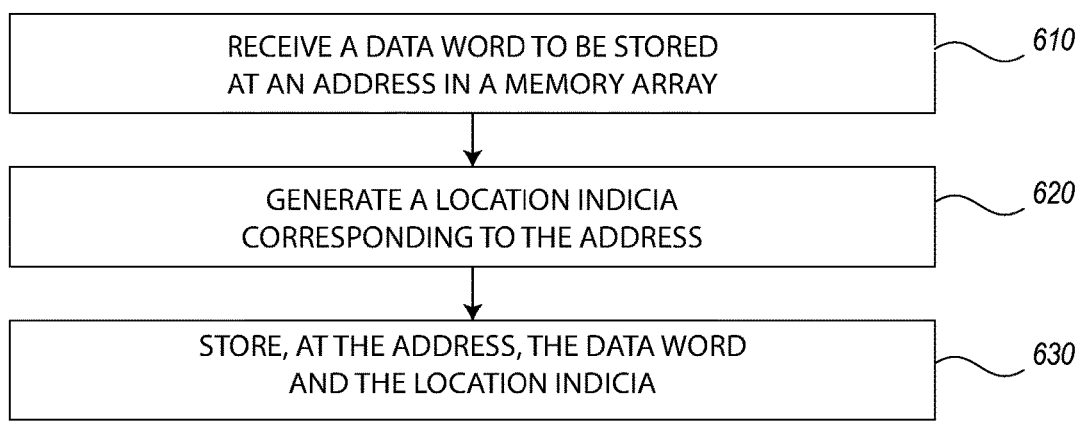
FIG. 6 is a flow chart illustrating a method of operating a memory device in accordance with an embodiment of the present technology.

FIG. 6 is a flow chart illustrating a method of operating a memory device in accordance with an embodiment of the present technology. The method includes receiving a data word to be stored at an address in a memory array of the memory device (box 610). The method further includes generating a location indicia corresponding to the address (box 620) and storing, at the address, the data word and the location indicia (box 630).

Figure 7:
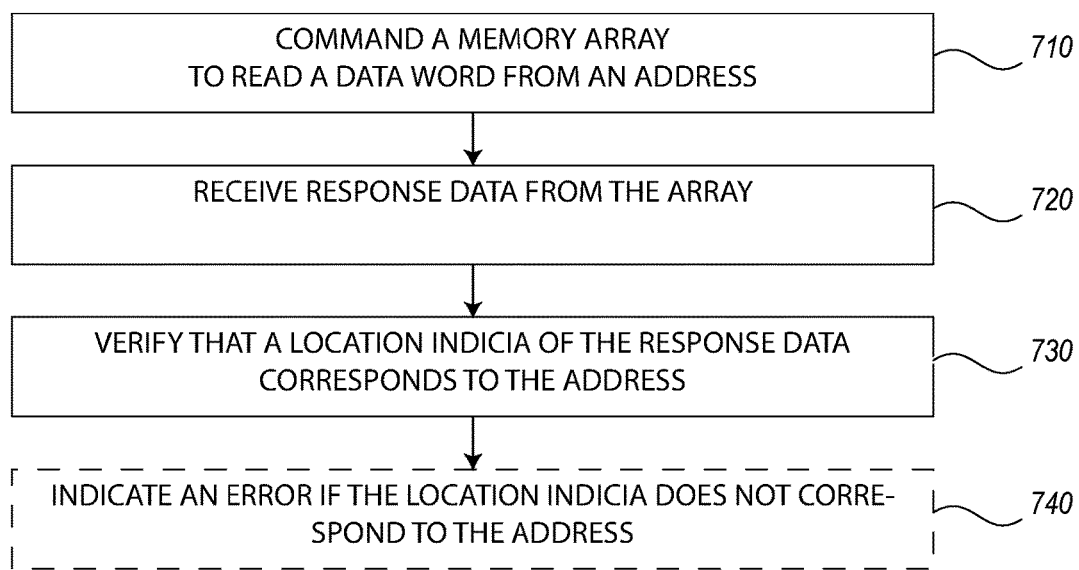
FIG. 7 is a flow chart illustrating a method of operating a memory device in accordance with an embodiment of the present technology.

FIG. 7 is a flow chart illustrating a method of operating a memory device in accordance with an embodiment of the present technology. The method includes commanding a memory array of the memory device to read a data word from an address (box 710) and receiving response data from the array (box 720). The method further includes verifying that a location indicia of the response data corresponds to the address (box 730). Optionally, if the location indicia does not correspond to the address, the method can further include indicating an error (box 740). If the location indicia does correspond to the address, the method can further include outputting the data word.

Figure 8:
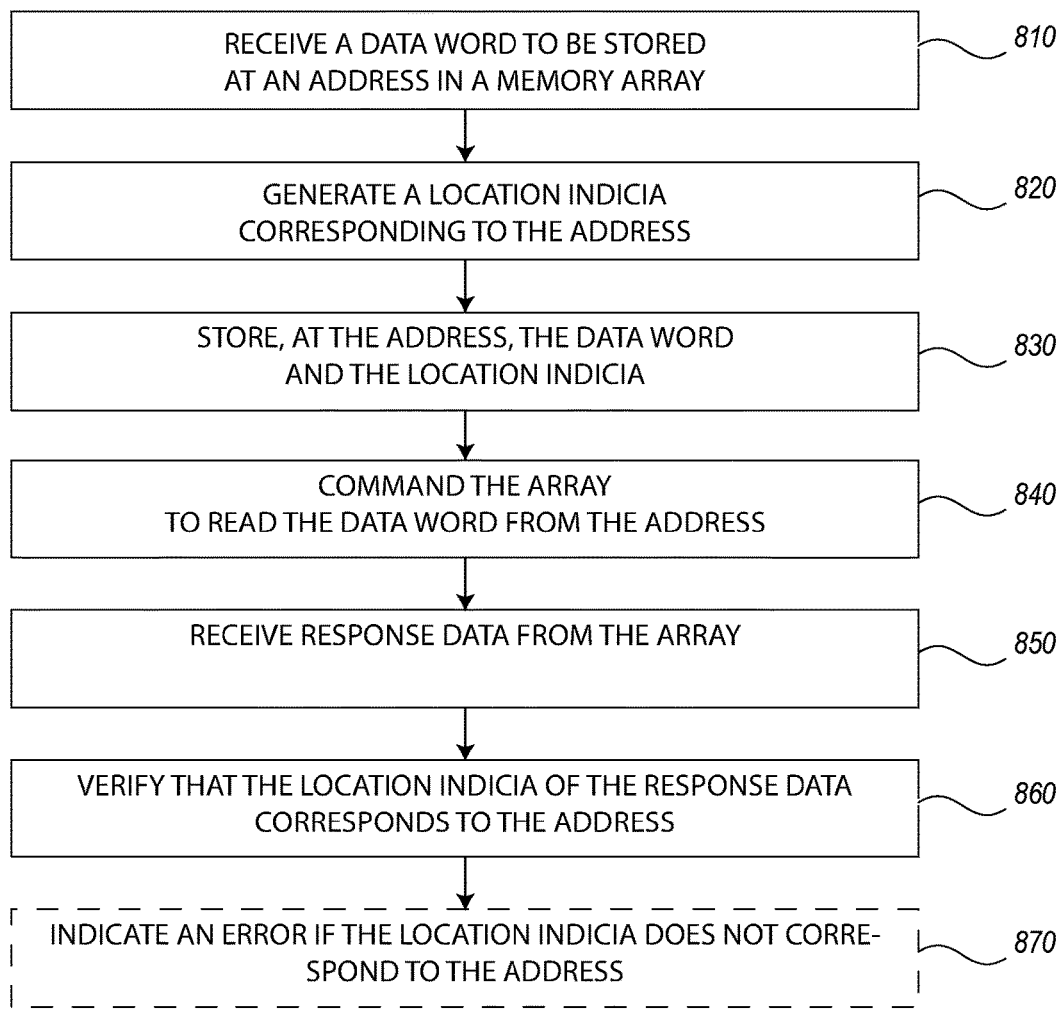
FIG. 8 is a flow chart illustrating a method of operating a memory device in accordance with an embodiment of the present technology.

FIG. 8 is a flow chart illustrating a method of operating a memory device in accordance with an embodiment of the present technology. The method includes receiving a data word to be stored at an address in a memory array of the memory device (box 810). The method further includes generating a location indicia corresponding to the address (box 820) and storing, at the address, the data word and the location indicia (box 830). The method can further include commanding the array to read the data word from the address (box 840), receiving response data from the array (box 850) and verifying that a location indicia of the response data corresponds to the address (box 860). If the second location indicia does not correspond to the address, the method can further include indicating an error (box 870). If the location indicia does correspond to the address, the method can further include outputting the data word.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A memory device, comprising a memory controller configured to:
   generate, for a data word to be stored at an address in a memory array, a location indicia corresponding to the address; and
   send the data word and the location indicia to the memory array for storage.

2. The memory device of claim 1, wherein the memory controller is further configured to:
   command the memory array to read the data word from the address,
   receive response data from the memory array, and
   verify that a location indicia of the response data corresponds to the address.

3. The memory device of claim 2, wherein the memory controller is further configured to:
   indicate an error if the location indicia of the response data does not correspond to the address.

4. The memory device of claim 2, wherein the memory controller is further configured to:
   output the data word if the location indicia of the response data corresponds to the address.

5. The memory device of claim 1, wherein the memory controller is further configured to:
   verify that a location indicia already stored at the address in the memory array corresponds to the address.

6. The memory device of claim 1, wherein the location indicia is a hash of the address.

7. The memory device of claim 1, wherein the address corresponds to a row of the memory array, and wherein the location indicia corresponds to the row.

8. The memory device of claim 1, wherein the location indicia is the address.

9. The memory device of claim 1, wherein the memory controller is configured to send the data word and the location indicia to the memory array for storage by appending or prepending the location indicia to the data word.

10. The memory device of claim 1, wherein the data word comprises a plurality of bits.

11. The memory device of claim 1, wherein the memory device comprises the memory array.

12. A method of operating a memory device, comprising:
    receiving a data word to be stored at an address in a memory array;
    generating a location indicia corresponding to the address; and
    sending the data word and the location indicia to the memory array for storage.

13. The method of claim 12, further comprising:
    commanding the memory array to read the data word from the address,
    receiving response data from the memory array, and
    verify that a location indicia of the response data corresponds to the address.

14. The method of claim 13, further comprising:
    indicating an error if the location indicia of the response data does not correspond to the address.

15. The method of claim 13, further comprising:
    outputting the data word if the location indicia of the response data corresponds to the address.

16. The method of claim 12, further comprising:
    generating the location indicia by hashing the address.

17. The method of claim 12, further comprising:
    appending or prepending the location indicia to the data word before sending the data word and the location indicia to the memory array for storage.

18. A memory system, comprising:
    a host device; and
    a memory device operatively coupled to the host device, the memory device configured to:
    receive a data word to be stored at an address in a memory array;
    generate a location indicia corresponding to the address; and
    send the data word and the location indicia to the memory array for storage.

19. The memory system of claim 18, wherein the memory device is further configured to:
    commanding the memory array to read the data word from the address,
    receiving response data from the memory array, and
    verify that a location indicia of the response data corresponds to the address.

20. The memory system of claim 18, wherein the memory device comprises the memory array.

* * * * *